(12) United States Patent
Zhang

(10) Patent No.: US 12,009,153 B2
(45) Date of Patent: Jun. 11, 2024

(54) BOX FOR ACCOMMODATING CAPACITOR AND RACK ASSEMBLY

(71) Applicants: SQ Technology(Shanghai) Corporation, Shanghai (CN); INVENTEC CORPORATION, Taipei (TW)

(72) Inventor: Shuai Zhang, Shanghai (CN)

(73) Assignees: SQ TECHNOLOGY(SHANGHAI) CORPORATION, Shanghai (CN); INVENTEC CORPORATION, Taipei (TW)

( * ) Notice: Subject to any disclaimer, the term of this patent is extended or adjusted under 35 U.S.C. 154(b) by 285 days.

(21) Appl. No.: 17/693,522

(22) Filed: Mar. 14, 2022

(65) Prior Publication Data

US 2023/0154682 A1 May 18, 2023

(30) Foreign Application Priority Data

Nov. 15, 2021 (CN) .......................... 202111349521.4

(51) Int. Cl.
| | | |
|---|---|---|
| H05K 5/00 | (2006.01) | |
| H01G 2/10 | (2006.01) | |
| H01G 4/224 | (2006.01) | |
| H01G 11/78 | (2013.01) | |
| H01G 11/82 | (2013.01) | |

(52) U.S. Cl.
CPC ............. *H01G 4/224* (2013.01); *H01G 2/106* (2013.01); *H05K 5/00* (2013.01); *H01G 11/78* (2013.01); *H01G 11/82* (2013.01)

(58) Field of Classification Search
CPC ........ H01G 4/224; H01G 2/106; H01G 11/78; H01G 11/82; H01G 2/10; H01G 2/04; H05K 5/00; Y02E 60/13
See application file for complete search history.

(56) References Cited

U.S. PATENT DOCUMENTS

| | | | |
|---|---|---|---|
| 2010/0232130 A1* | 9/2010 | Kodama | ................ H01G 2/106 361/811 |
| 2018/0337372 A1* | 11/2018 | Rivera | ................ H01M 50/251 |
| 2021/0304962 A1* | 9/2021 | Hadwan | ................ H01G 2/02 |

OTHER PUBLICATIONS

English Translation TW201926326, Tasi Hui-Ming, Published Jul. 1, 2019 (Year: 2019).*

* cited by examiner

*Primary Examiner* — Steven T Sawyer
(74) *Attorney, Agent, or Firm* — Locke Lord LLP; Tim Tingkang Xia, Esq.

(57) ABSTRACT

This invention provides a box for accommodating capacitor including bottom plate, two first side plates, two second side plates, fixed engagement structure and movable engagement structure. First side plates are disposed opposite to each other. Second side plates are disposed opposite to each other. Side plates are respectively connected to a plurality of side edges of bottom plate so that bottom plate and side plates together form accommodation space. Fixed engagement structure and the movable engagement structure are respectively connected to first side plates. Fixed engagement structure and movable engagement structure are located at a side of accommodation space that is located farthest from bottom plate. Movable engagement structure includes cantilever part and engagement part. Cantilever part is connected to one of first side plates. Engagement part protrudes from movable end part of cantilever part.

8 Claims, 7 Drawing Sheets

BOX FOR ACCOMMODATING CAPACITOR AND RACK ASSEMBLY

CROSS-REFERENCE TO RELATED APPLICATIONS

This non-provisional application claims priority under 35 U.S.C. § 119(a) on Patent Application No(s). 202111349521.4 filed in China, on Nov. 15, 2021, the entire contents of which are hereby incorporated by reference.

BACKGROUND OF THE INVENTION

Technical Field of the Invention

The invention relates to a box for accommodating at least one capacitor and a rack assembly, more particularly to a box and a rack assembly allowing at least one capacitor to be engaged therein.

Description of the Related Art

With the development of the internet, the demand for a server including a plurality of disk drives increases, and the mechanism for protecting a supercapacitor (SC) draws more attention. However, in conventional servers, the mechanism for installing the supercapacitor only takes one kind of the server into consideration, and the supercapacitor is fixed in the server by screwing, thereby causing the installation of the supercapacitor to be inconvenient.

SUMMARY OF THE INVENTION

The invention is to provide a box for accommodating at least one capacitor and a rack assembly to install the capacitor in an electronic device in a convenient manner.

One embodiment of this invention provides a box for accommodating at least one capacitor including a bottom plate, two first side plates, two second side plates, a fixed engagement structure and a movable engagement structure. The two first side plates are disposed opposite to each other. The two second side plates are disposed opposite to each other. The two first side plates and the two second side plates are respectively connected to a plurality of side edges of the bottom plate so that the bottom plate, the two first side plates and the two second side plates together form an accommodation space. The fixed engagement structure and the movable engagement structure are respectively connected to the two first side plates. The fixed engagement structure and the movable engagement structure are located at a side of the accommodation space that is located farthest from the bottom plate. The movable engagement structure includes a cantilever part and an engagement part. The cantilever part is connected to one of the two first side plates. The engagement part protrudes from a movable end part of the cantilever part.

Another embodiment of this invention provides a rack assembly including a cage and a box for accommodating at least one capacitor. The box is removably disposed on the cage and includes a bottom plate, two first side plates, two second side plates, a fixed engagement structure and a movable engagement structure. The two first side plates are disposed opposite to each other. The two second side plates are disposed opposite to each other. The two first side plates and the two second side plates are respectively connected to a plurality of side edges of the bottom plate so that the bottom plate, the two first side plates and the two second side plates together form an accommodation space. The fixed engagement structure and the movable engagement structure are respectively connected to the two first side plates. The fixed engagement structure and the movable engagement structure are located at a side of the accommodation space that is located farthest from the bottom plate. The movable engagement structure includes a cantilever part and an engagement part. The cantilever part is connected to one of the two first side plates. The engagement part protrudes from a movable end part of the cantilever part.

According to the box for accommodating at least one capacitor and the rack assembly discussed above, with the cooperation of the fixed engagement structure and the movable engagement structure, the capacitor can be accommodated into or removed from the box in a convenient manner.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
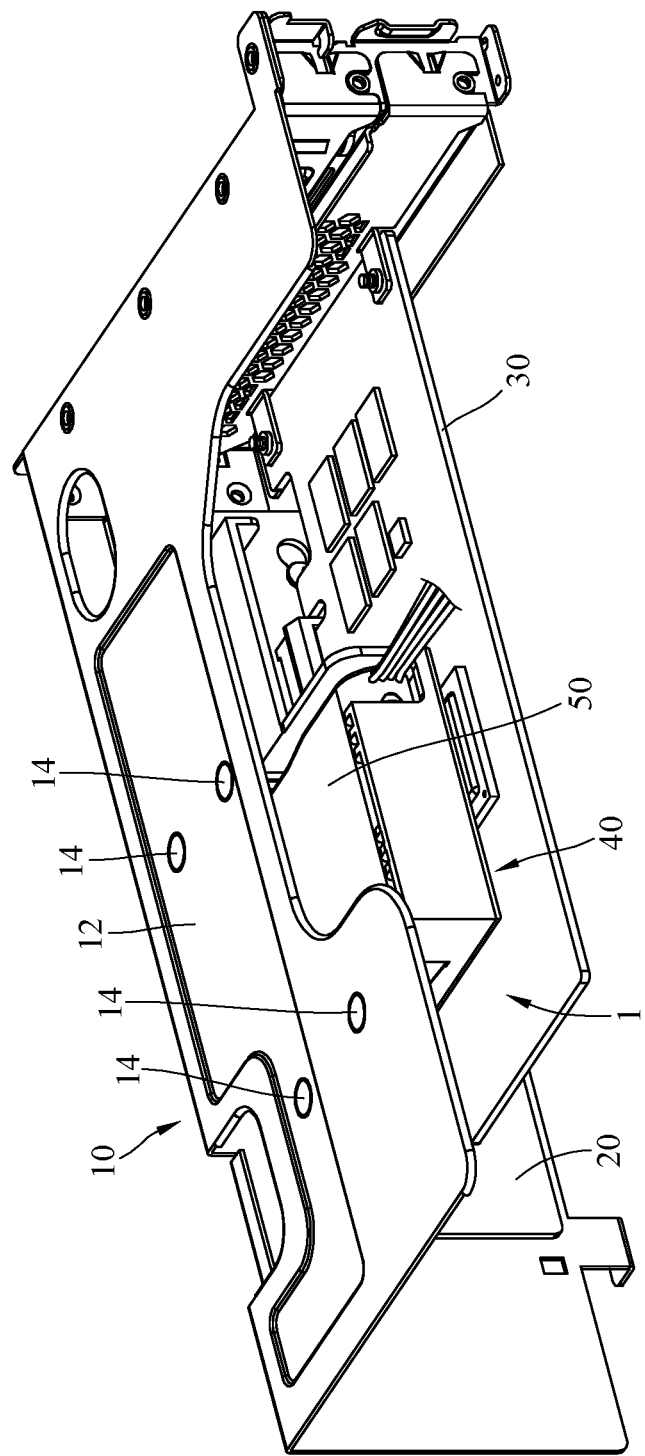
FIG. 1 is a perspective view of a rack assembly according to a first embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
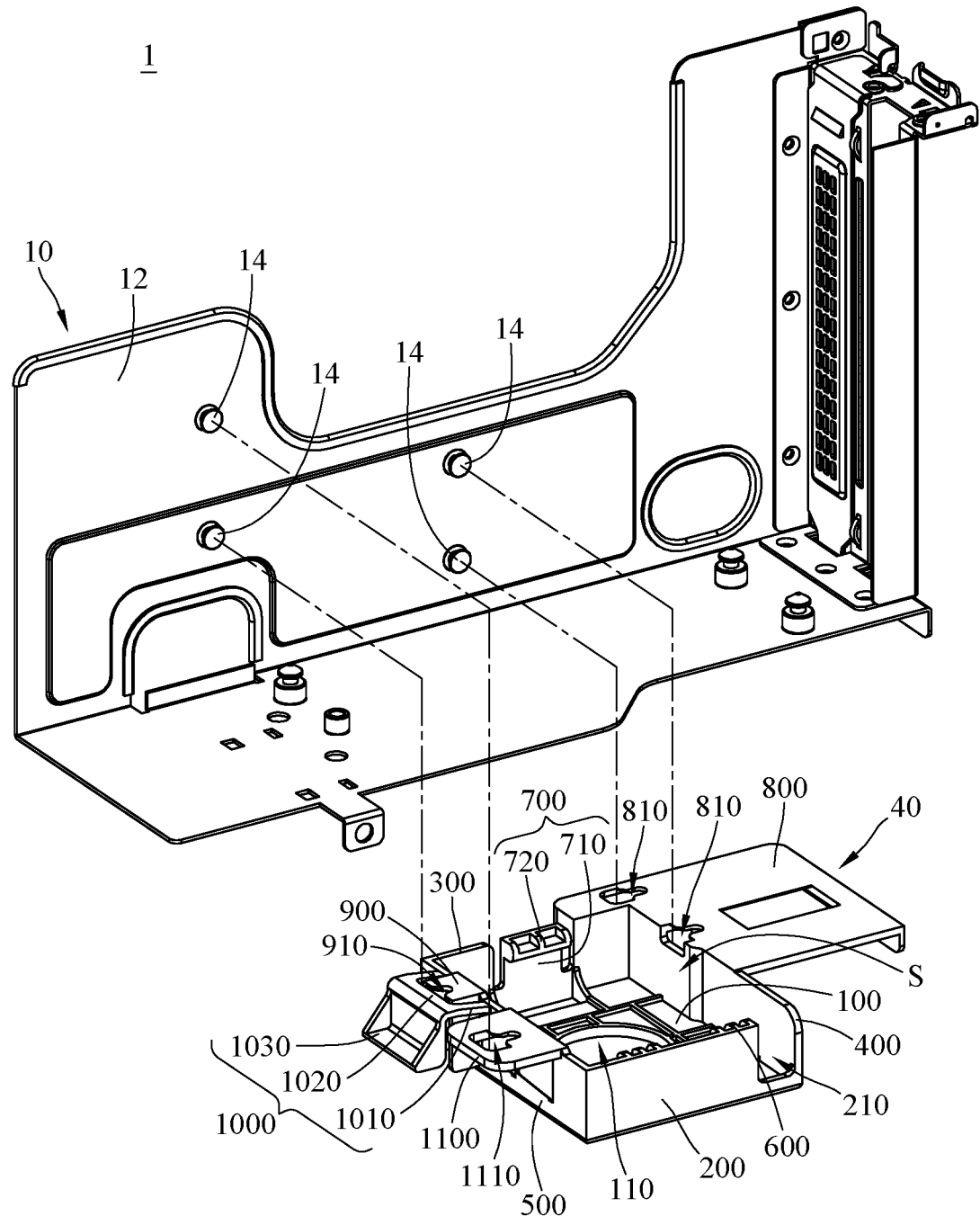
FIG. 2 is an exploded view of the rack assembly in FIG. 1.
Figure 3:
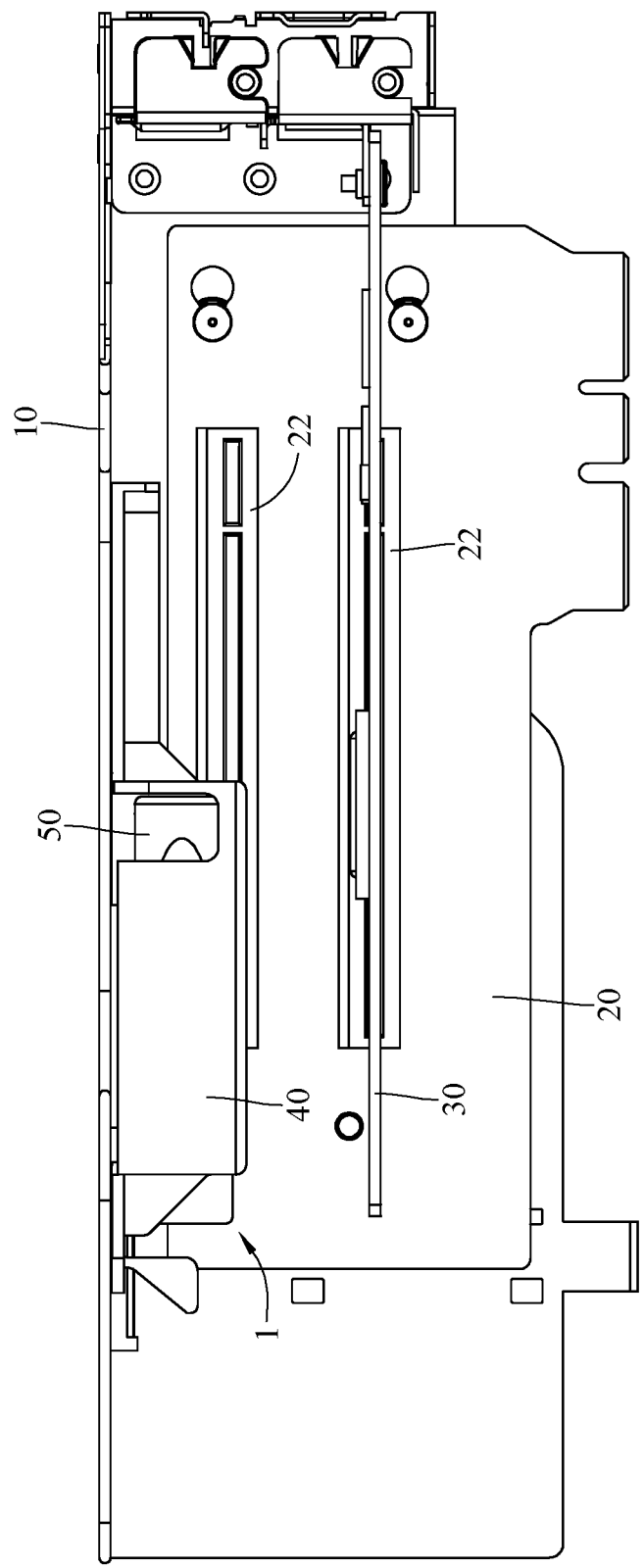
FIG. 3 is a side view of the rack assembly in FIG. 1.
Figure 4:
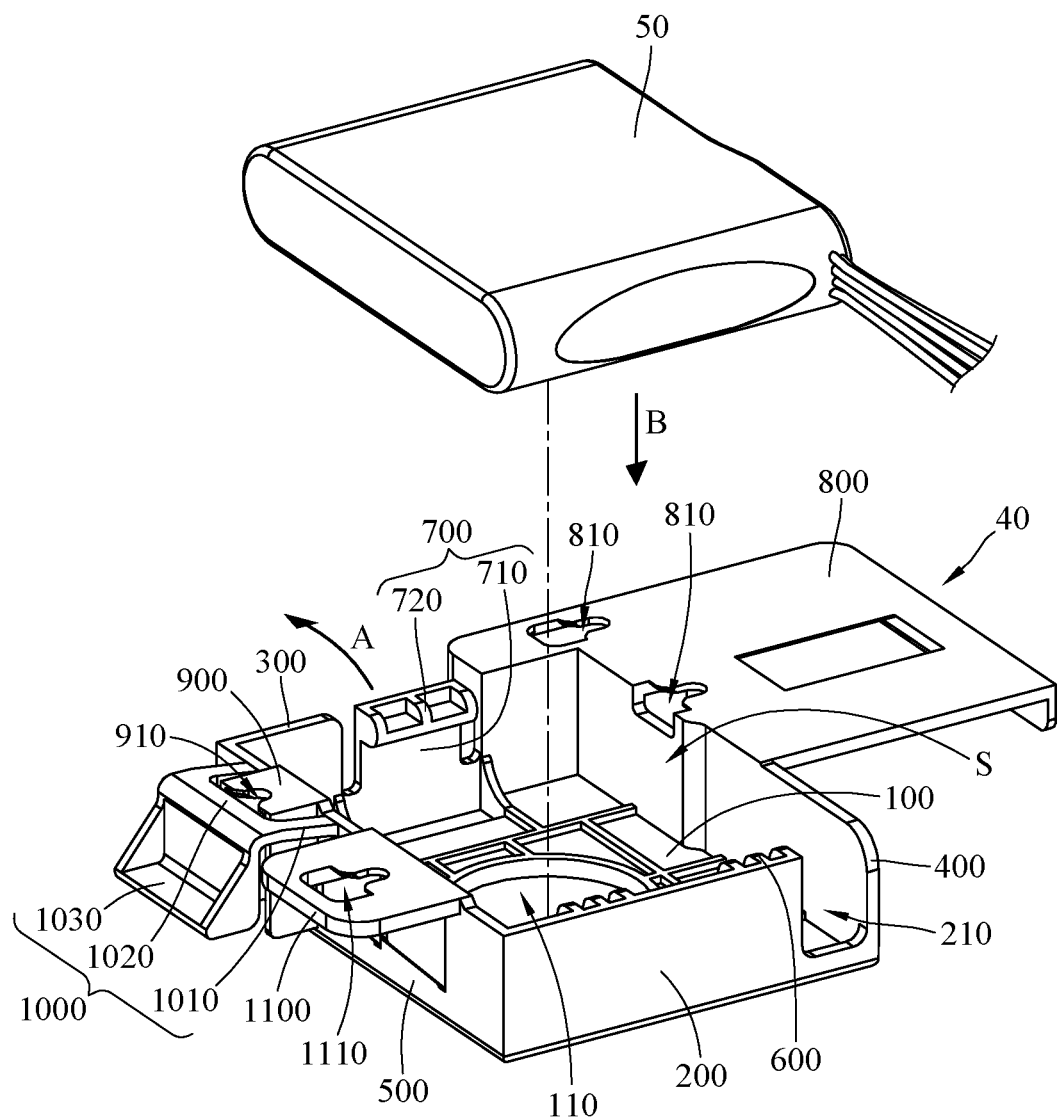
FIG. 4 is a perspective view showing the installation of a capacitor.
Figure 5:
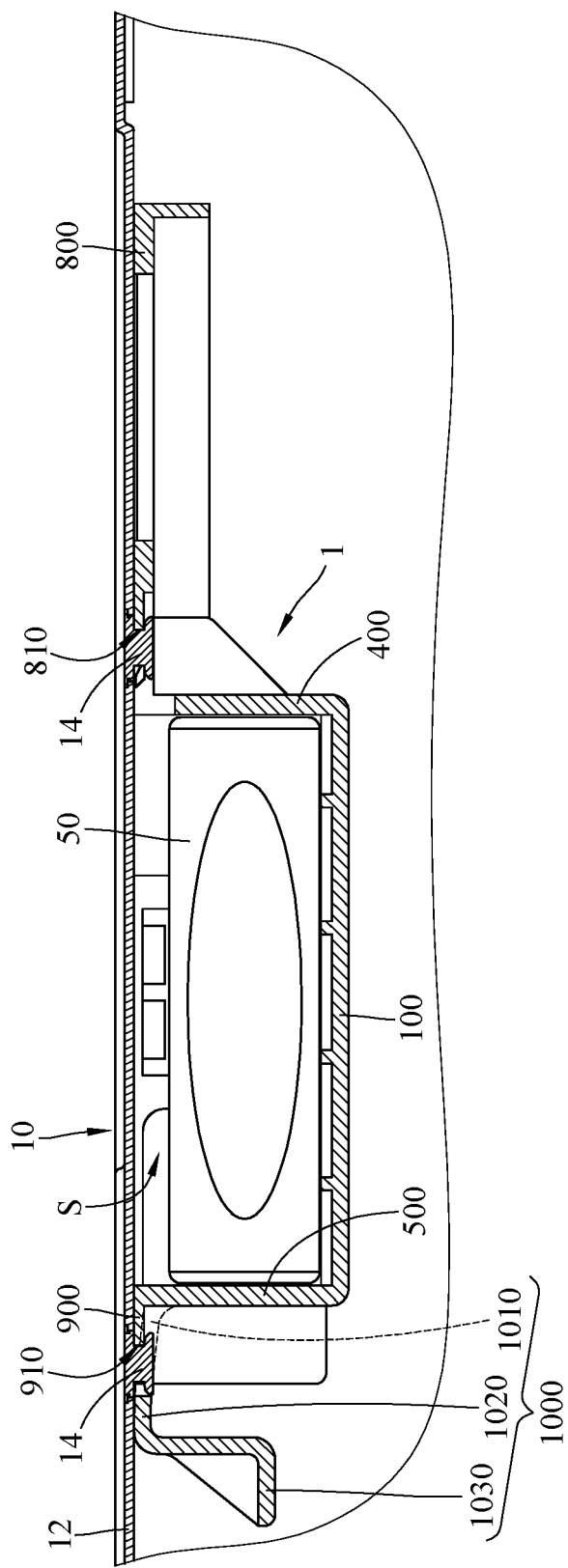
FIG. 5 is a partially enlarged cross-sectional view of the rack assembly 1 in FIG. 1.

Please refer to FIGS. 1 to 5, where FIG. 1 is a perspective view of a rack assembly 1 according to a first embodiment of the invention, FIG. 2 is an exploded view of the rack assembly 1 in FIG. 1, FIG. 3 is a side view of the rack assembly 1 in FIG. 1, FIG. 4 is a perspective view showing the installation of a capacitor 50, and FIG. 5 is a partially enlarged cross-sectional view of the rack assembly 1 in FIG. 1.

In this embodiment, the rack assembly 1 includes a cage 10 for an expansion card 30 and a box 40 for the capacitor 50. The cage 10 may include a main body 12 and a plurality of fasteners 14. For example, an expansion card 30 is configured to be installed on the main body 12. Specifically, the expansion card 30 meets, for example, PCIE standard, and is installed on the main body 12 via a riser card 20. For example, the riser card 20 has two connectors 22 each for the expansion card 30 to be plugged therein. For example, the fasteners 14 are I-shaped bolts configured to be fixed in pear-shaped holes, and are riveted on the main body 12.

In this embodiment, the riser card 20 has two connectors 22, but the invention is not limited thereto. In other embodiments, the riser card may merely have one connector.

The main body 12 can accommodate two expansion cards. However, in order to install the box 40 on the main body 12, one of the two expansion cards may be removed from the main body 12 so that the box 40 can be installed on the main body 12 without the interference of the removed expansion card. In this embodiment, the box 40 is removably disposed on the cage 10, which will be described in detail later. The box 40 includes a bottom plate 100, two first side plates 200 and 300 and two second side plates 400 and 500. The two first side plates 200 and 300 are disposed opposite to each other. The two second side plates 400 and 500 are disposed opposite to each other. The first and second side plates 200, 300, 400 and 500 are respectively connected to side edges of the bottom plate 100, such that the bottom plate 100 and the first and second side plates 200, 300, 400 and 500 together form an accommodation space S. The capacitor 50 is configured to be accommodated in the accommodation space S and is, for example, a supercapacitor. The capacitor 50 is accommodated into or removed from the accommodation space S via a top opening formed by side plates 200, 300, 400 and 500 and connected to the accommodation space S.

In this embodiment, the bottom plate 100 may have an opening 110. The opening 110 is connected to the accommodation space S and is located opposite to the top opening. A user can push the capacitor 50 out of the accommodation space S by sticking a finger or another object through the opening 110.

In this embodiment, the first side plate 200 may have an opening 210 for cable management. Specifically, at least one cable of the capacitor 50 is disposed through the opening 210.

In this embodiment, the box 40 may further include a fixed engagement structure 600 and a movable engagement structure 700. The fixed engagement structure 600 and the movable engagement structure 700 are connected to the two first side plates 200 and 300, respectively. The fixed engagement structure 600 and the movable engagement structure 700 are located on a side of the accommodation space S that is located farthest away from the bottom plate 100. The movable engagement structure 700 includes a cantilever part 710 and an engagement part 720. A fixed end part of the cantilever part 710 is fixed to the first side plate 300, and the engagement part 720 protrudes from a movable end part of the cantilever part 710 that is located opposite to the fixed end part of the cantilever part 710.

Figure 6:
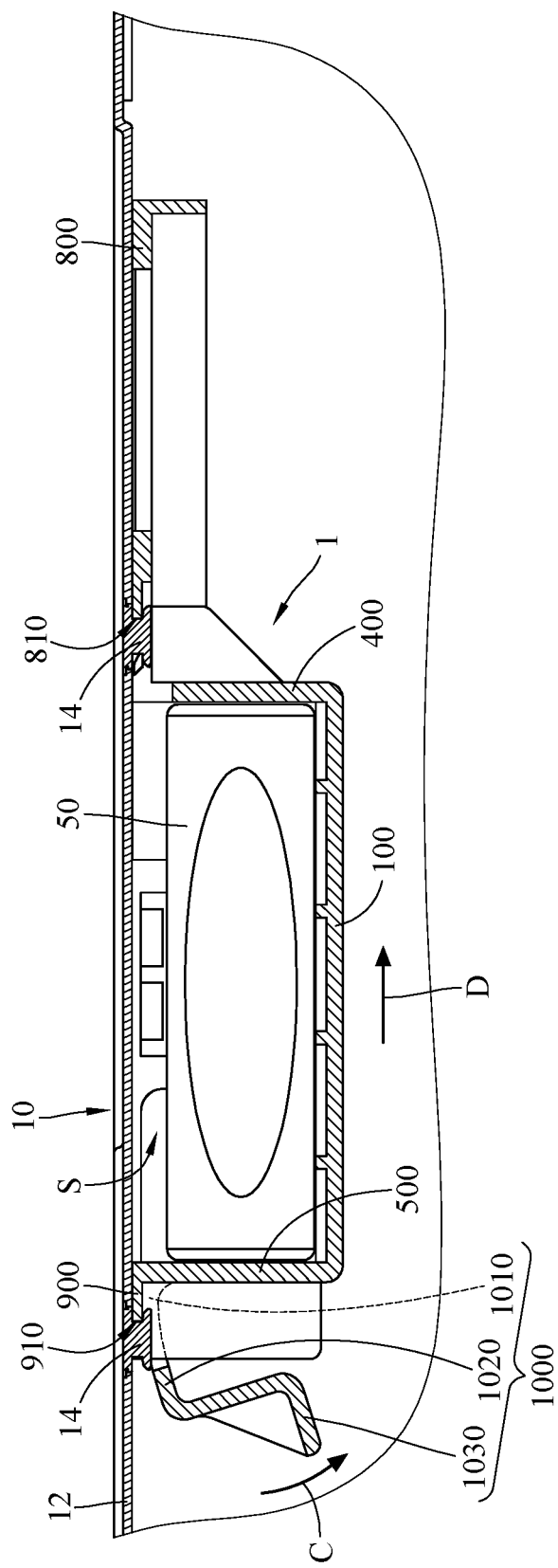
FIGS. 6-7 are cross-sectional views showing the assembly procedure of a box and a cage of the rack assembly in FIG. 1.

In this embodiment, the box 40 may further include a first protruding plate 800, a second protruding plate 900 and a blocking component 1000. The first protruding plate 800 protrudes from the second side plate 400. The second protruding plate 900 protrudes from the second side plate 500. The blocking component 1000 is movably disposed on the second side plate 500. The first protruding plate 800 has two first fastening holes 810. The second protruding plate 900 has a recess 910. The blocking component 1000 includes a cantilever portion 1010, a blocking portion 1020 and a handle portion 1030. A fixed end part of the cantilever portion 1010 is fixed to the second side plate 500. The blocking portion 1020 is fixed to a movable end part of the cantilever portion 1010 that is located opposite to the fixed end part of the cantilever portion 1010. The handle portion 1030 is fixed to the blocking portion 1020 for moving the blocking portion 1020 relative to the second protruding plate 900. In this way, the blocking component 1000 is movable between a blocking position (as shown in FIG. 5) and a releasing position (as shown in FIG. 6) relative to the second side plate 500. When the blocking component 1000 is located at the blocking position, the second protruding plate 900 and the blocking portion 1020 together form a second fastening hole for a corresponding fastener 14 to be disposed therein; that is, the blocking portion 1020 closes the recess 910 of the second protruding plate 900, such that the blocking portion 1020 and the second protruding plate 900 are fixed to the corresponding fastener 14. Three of the fasteners 14 are removably disposed in the two first fastening holes 810 and the second fastening hole, respectively. When the blocking component 1000 is located at the releasing position, a vertical distance between the blocking portion 1020 and the bottom plate 100 is smaller than that between the second protruding plate 900 and the bottom plate 100. That is, the blocking portion 1020 of the blocking component 1000 is not located on a side of the corresponding fastener 14, and thus the corresponding fastener 14 is not blocked by the blocking component 1000 so as to be released.

In this embodiment, the first protruding plate 800 has two first fastening holes 810, but the invention is not limited thereto. In other embodiments, the first protruding plate may merely have one first fastening hole.

In this embodiment, the box 40 may further include a third protruding plate 1100. The third protruding plate 1100 protrudes from the second side plate 500 and has a third fastening hole 1110. The third protruding plate 1100 and the second protruding plate 900 are arranged side by side. The fasteners 14 are removably disposed in the two first fastening holes 810, the second fastening hole and the third fastening hole 1110, respectively. The box 40 is able to slide relative to the cage 10 and the fasteners 14 may be consider as being slidably disposed in respective fastening holes.

The assembly procedure of the capacitor 50 and the box 40 is firstly described. As shown in FIG. 4, in order to accommodate the capacitor 50 into the accommodation space S, the movable engagement structure 700 is bent outwards along a direction A and then the capacitor 50 is placed into the accommodation space S along a direction B, or the capacitor 50 is directly pushed into the accommodation space S along the direction B while forcing the movable engagement structure 700 to be bent outwards along the direction A. On the other hand, in order to remove the capacitor 50 from the accommodation space S, the movable engagement structure 700 is bent outwards along the direction B and then the capacitor 50 can be moved out of the accommodation space S by turning over the box 40 or sticking a finger or another object through the opening 110.

Next, the assembly procedure of the box 40 and the cage 10 are described. As shown in FIG. 5, the box 40 with the capacitor 50 accommodated therein is assembled to the cage 10. Further, the blocking component 1000 is located at the blocking position, such that a corresponding one fastener 14 is disposed in the second fastening hole together formed by the second protruding plate 900 and the blocking portion 1020. Thus, the box 40 is stably fixed to the cage 10.

Figure 7:
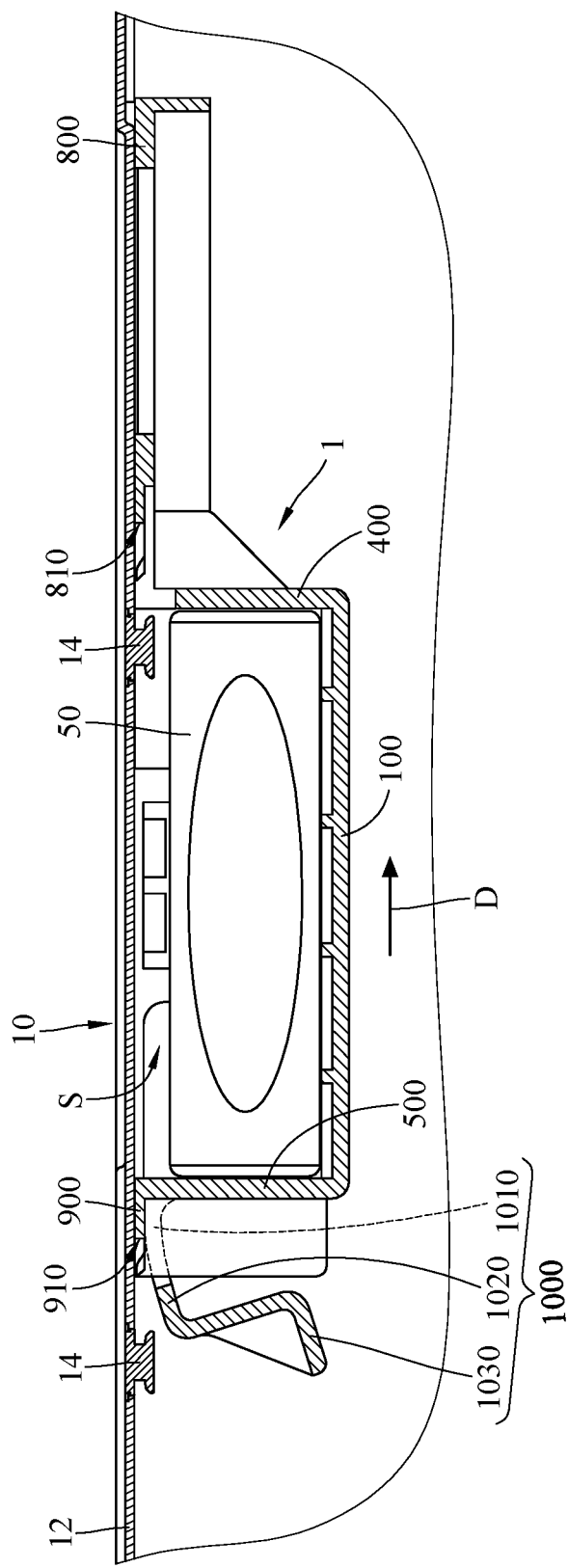

Next, the procedure of removing the box 40 from the cage 10 is described. Please refer to FIGS. 6 to 7 that are cross-sectional views showing the removal procedure of the box 40 from the cage 10 of the rack assembly 1 in FIG. 1. As shown in FIG. 6, the handle portion 1030 of the blocking component 1000 is pressed along a direction C so as to force the blocking portion 1020 to be moved downwards to the releasing position to release the blocked fastener 14. That is, the blocking portion 1020 of the blocking component 1000 no longer blocks the fastener 14. Therefore, the box 40 is able to slide relative to the cage 10. Next, the box 40 is moved along a direction D so that the fasteners 14 are detached from respective fastening holes (as shown in FIG. 7), thereby allowing the box 40 to be removed from the cage 10. The box 40 can be installed on the cage 10 by a procedure opposite to the aforementioned assembly procedure.

According to the box for accommodating at least one capacitor and the rack assembly discussed above, with the cooperation of the fixed engagement structure and the movable engagement structure, the capacitor can be accommodated into or removed from the box in a convenient manner.

Furthermore, the fasteners are removable from respective fastening holes, and the movable blocking component can be moved away from the fastener. Thus, the box is allowed to be assembled to or removed from the cage via pressing the movable blocking component and then pushing the box without screwing or removing screws, thereby enhancing the convenience for assembling the box and the cage.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A box for accommodating at least one capacitor, comprising:
    a bottom plate;
    two first side plates and two second side plates, wherein the two first side plates are disposed opposite to each other, the two second side plates are disposed opposite to each other, the two first side plates and the two second side plates are respectively connected to a plurality of side edges of the bottom plate so that the bottom plate, the two first side plates and the two second side plates together form an accommodation space; and
    a fixed engagement structure and a movable engagement structure, respectively connected to the two first side plates, wherein the fixed engagement structure and the movable engagement structure are located at a side of the accommodation space that is located farthest from the bottom plate, the movable engagement structure comprises a cantilever part and an engagement part, the cantilever part is connected to one of the two first side plates, and the engagement part protrudes from a movable end part of the cantilever part;
    wherein the box further comprises a first protruding plate, a second protruding plate and a blocking component, the first protruding plate is connected to one of the two second side plates, the second protruding plate is connected to another one of the two second side plates, the blocking component is movably connected to the another one of the two second side plates, the first protruding plate has at least one first fastening hole, the second protruding plate has a recess, the blocking component comprises a cantilever portion and a blocking portion, the cantilever portion is connected to the another one of the two second side plates, the blocking portion is connected to the cantilever portion, the blocking component is movable between a blocking position and a releasing position relative to the another one of the second side plates; when the blocking component is located at the blocking position, the second protruding plate and the blocking portion together form a second fastening hole; when the blocking component is located at the releasing position, a vertical distance between the blocking portion and the bottom plate is smaller than a vertical distance between the second protruding plate and the bottom plate.

2. The box according to claim 1, wherein the blocking component further comprising a handle portion that is connected to the blocking portion.

3. The box according to claim 1, further comprising a third protruding plate, wherein the third protruding plate is connected to the another one of the two second side plates, and the third protruding plate and the second protruding plate are arranged side by side.

4. The box according to claim 1, wherein the bottom plate has an opening that is connected to the accommodation space.

5. A rack assembly, comprising:
    a cage; and
    a box for accommodating at least one capacitor, removably disposed on the cage, the box comprising:
        a bottom plate;
        two first side plates and two second side plates, wherein the two first side plates are disposed opposite to each other, the two second side plates are disposed opposite to each other, the two first side plates and the two second side plates are respectively connected to a plurality of side edges of the bottom plate so that the bottom plate, the two first side plates and the two second side plates together form an accommodation space; and
        a fixed engagement structure and a movable engagement structure, respectively connected to the two first side plates, wherein the fixed engagement structure and the movable engagement structure are located at a side of the accommodation space that is located farthest from the bottom plate, the movable engagement structure comprises a cantilever part and an engagement part, the cantilever part is connected to one of the two first side plates, the engagement part protrudes from a movable end part of the cantilever part;
    wherein the cage further comprises a main body and a plurality of fasteners, the plurality of fasteners are fixed to the main body, the box further comprises a first protruding plate, a second protruding plate and a blocking component, the first protruding plate is connected to one of the two second side plates, the second protruding plate is connected to another one of the two second side plates, the blocking component is movably connected to the another one of the two second side plates, the first protruding plate has at least one first fastening hole, the second protruding plate has a recess, the blocking component comprises a cantilever portion and a blocking portion, the cantilever portion is connected to the another one of the two second side plates, the blocking portion is connected to the cantilever portion, the blocking component is movable between a blocking position and a releasing position relative to the another one of the second side plates; when the blocking component is located at the blocking position, the second protruding plate and the blocking portion together form a second fastening hole, the plurality of fasteners are removably disposed in the first fastening hole and the second fastening hole; when the blocking component is located at the releasing position, a vertical distance between the blocking portion and the bottom plate is smaller than a vertical distance between the second protruding plate and the bottom plate.

6. The rack assembly according to claim 5, wherein the blocking component further comprising a handle portion that is connected to the blocking portion.

7. The rack assembly according to claim 5, wherein the box further comprises a third protruding plate, the third protruding plate is connected to the another one of the two second side plates and has a third fastening hole, and the third protruding plate and the second protruding plate are arranged side by side, the fasteners are removably disposed in the first fastening hole, the second fastening hole and the third fastening hole.

8. The rack assembly according to claim 5, wherein the bottom plate has an opening that is connected to the accommodation space.

\* \* \* \* \*